US012635488B2

(12) United States Patent
Yang et al.

(10) Patent No.: US 12,635,488 B2
(45) Date of Patent: May 19, 2026

(54) MERGED TRENCHES SURROUNDED BY WIDER TRENCH FOR ISOLATING SEMICONDUCTOR DEVICES

(71) Applicant: TEXAS INSTRUMENTS INCORPORATED, Dallas, TX (US)

(72) Inventors: Hao Yang, Allen, TX (US); Asad Haider, Plano, TX (US); Guruvayurappan Mathur, Allen, TX (US); Abbas Ali, Plano, TX (US); Alexei Sadovnikov, Sunnyvale, CA (US); Umamaheswari Aghroam, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 679 days.

(21) Appl. No.: 17/977,403

(22) Filed: Oct. 31, 2022

(65) Prior Publication Data

US 2024/0145293 A1 May 2, 2024

(51) Int. Cl.
*H01L 21/762* (2006.01)
*H10D 62/10* (2025.01)

(52) U.S. Cl.
CPC .. *H01L 21/76229* (2013.01); *H01L 21/76237* (2013.01); *H10D 62/115* (2025.01)

(58) Field of Classification Search
CPC ......... H01L 21/76229; H01L 21/76237; H01L 21/76224; H10D 62/115
See application file for complete search history.

(56) References Cited

U.S. PATENT DOCUMENTS

2019/0096744 A1* 3/2019 Hu ....................... H10D 62/371
2020/0328125 A1* 10/2020 Tsai .................. H01L 21/76224
2021/0134602 A1* 5/2021 Arshad ............. H01L 21/30625

* cited by examiner

*Primary Examiner* — Julia Slutsker
(74) *Attorney, Agent, or Firm* — Yudong Kim; Frank D. Cimino

(57) ABSTRACT

Active semiconductor devices in an integrated circuit are provided lateral electrical isolation by surrounding narrow deep trench isolation regions that are merged at shared portions of the narrow deep trench isolation regions. A wide deep trench isolation region laterally surrounds the merged narrow deep trench isolation regions.

20 Claims, 9 Drawing Sheets

MERGED TRENCHES SURROUNDED BY WIDER TRENCH FOR ISOLATING SEMICONDUCTOR DEVICES

TECHNICAL FIELD

This description relates generally to semiconductor device fabrication, and more particularly to merged trenches surrounded by a wider trench for isolating semiconductor devices.

BACKGROUND

An active semiconductor device (e.g., a diode, a bipolar junction transistor (BJT), or a field-effect transistor (FET)) can fabricated on a wafer and can be surrounded, in a top-down view of the wafer, by lateral isolation features that spatially and electrically separate the active semiconductor device from one or more other active semiconductor devices fabricated on the wafer. The lateral isolation features can include deep trench isolation (DTI) trenches, which can be etched into the semiconductor (e.g., silicon) substrate and lined with material having dielectric properties (e.g., an oxide), and filled with a conductive material (e.g., polysilicon). The trenches can concentrically surround an active device region, also referred to herein as an isolation tank or simply a "tank". Each tank can have one or more active semiconductor devices fabricated inside it ("tanked" devices). The concentric rings of lateral isolation subregions can be circular or have other shapes (e.g., elliptical, rectangular, square) with sharp or rounded corners.

SUMMARY

An example IC includes a first active semiconductor device laterally surrounded by a first lateral isolation trench region having a first trench depth and a first trench width. The IC further includes a second active semiconductor device laterally surrounded by a second lateral isolation trench region having a second trench depth and a second trench width. A portion of the second trench region is shared with a portion of the first trench region. The IC further includes a third lateral isolation trench region surrounding the first and second trench regions. The third trench region has a third trench depth greater than the first and second trench depths, and a third trench width greater than the first and second trench widths.

An example method of fabricating an IC includes forming a first lateral isolation trench region laterally surrounding a first active semiconductor device. The first trench region has a first trench depth. The method further includes forming a second lateral isolation trench region laterally surrounding a second active semiconductor device. The second trench region has a second trench depth. A portion of the second trench region is shared with a portion of the first trench region. The method further includes forming a third lateral isolation trench region laterally surrounding the first and second trench regions. The third trench region has a third trench depth greater than the first and second trench depths.

Another example IC includes a substrate of a first conductivity type and epitaxial semiconductor material over the substrate. The epitaxial semiconductor material has a surface region of the first conductivity type and a buried layer of a second conductivity type opposite the first conductivity type. The IC further includes first and second active semiconductor devices in the surface region. The IC further includes a first lateral isolation trench having a first portion between the first and second active semiconductor devices and a second portion not between the first and second active semiconductor devices at a first lateral distance from the first active semiconductor device. The first trench has a first width and a first depth, the first depth greater than a depth of the buried layer. The IC further includes a second lateral isolation trench laterally surrounding the first trench and the first and second active semiconductor devices and at a second lateral distance from the first active semiconductor device. The second lateral distance is greater than the first lateral distance. The second trench has a second width greater than the first width and a second depth greater than the first depth. The IC further includes insulating material lining side and bottom surfaces of the first trench and side surfaces of the second trench. Conductive material fills the first and second trenches. The conductive material of the second trench is electrically coupled to the substrate.

DETAILED DESCRIPTION

In a dual deep-trench layout configuration, an isolation tank fabricated on an integrated circuit is surrounded by two trench rings, an inner trench ring that is narrower than an outer trench ring. Dual-trench layout configurations can be used to isolate active semiconductor devices operating at higher potential differences, e.g., in excess of 85 V.

Figure 1:
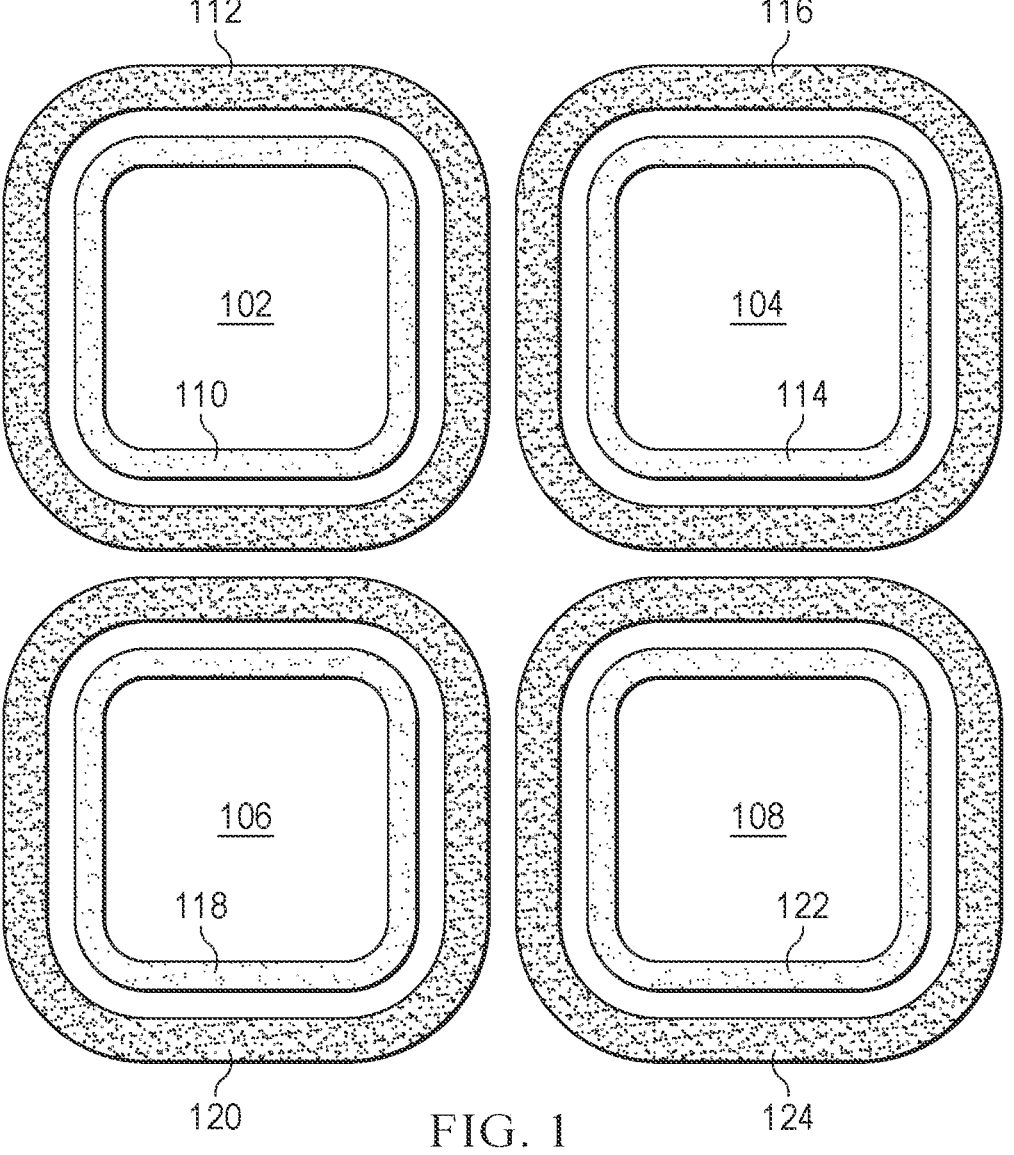
FIG. 1 is top-down schematic view of an example portion of an integrated circuit having four isolation tanks each surrounded by both a narrow deep trench and a wide deep trench.

FIG. 1 shows, in a top-down view, a first dual deep-trench layout configuration in which four isolation tanks 102, 104, 106, 108 are spatially and electrically isolated from each other by dual trenches. First tank 102 is concentrically surrounded (laterally) by a first narrow deep trench region 110 and a first wide deep trench region 112. Second tank 104 is concentrically surrounded (laterally) by a second narrow deep trench region 114 and a second wide deep trench region 116. Third tank 106 is concentrically surrounded (laterally) by a third narrow deep trench region 118 and a third wide deep trench region 120. Fourth tank 108 is concentrically surrounded (laterally) by a fourth narrow deep trench region 122 and a fourth wide deep trench region 124. In the dual deep-trench layout configuration of FIG. 1, each of the wide deep trench regions 112, 116, 120, 124 are separate from each other and do not share trench region portions with each other. Each tank 102, 104, 106, 108 can contain one or more active semiconductor devices (not shown), such as devices configured or expected to operate at 85 V or more.

Figure 7A:
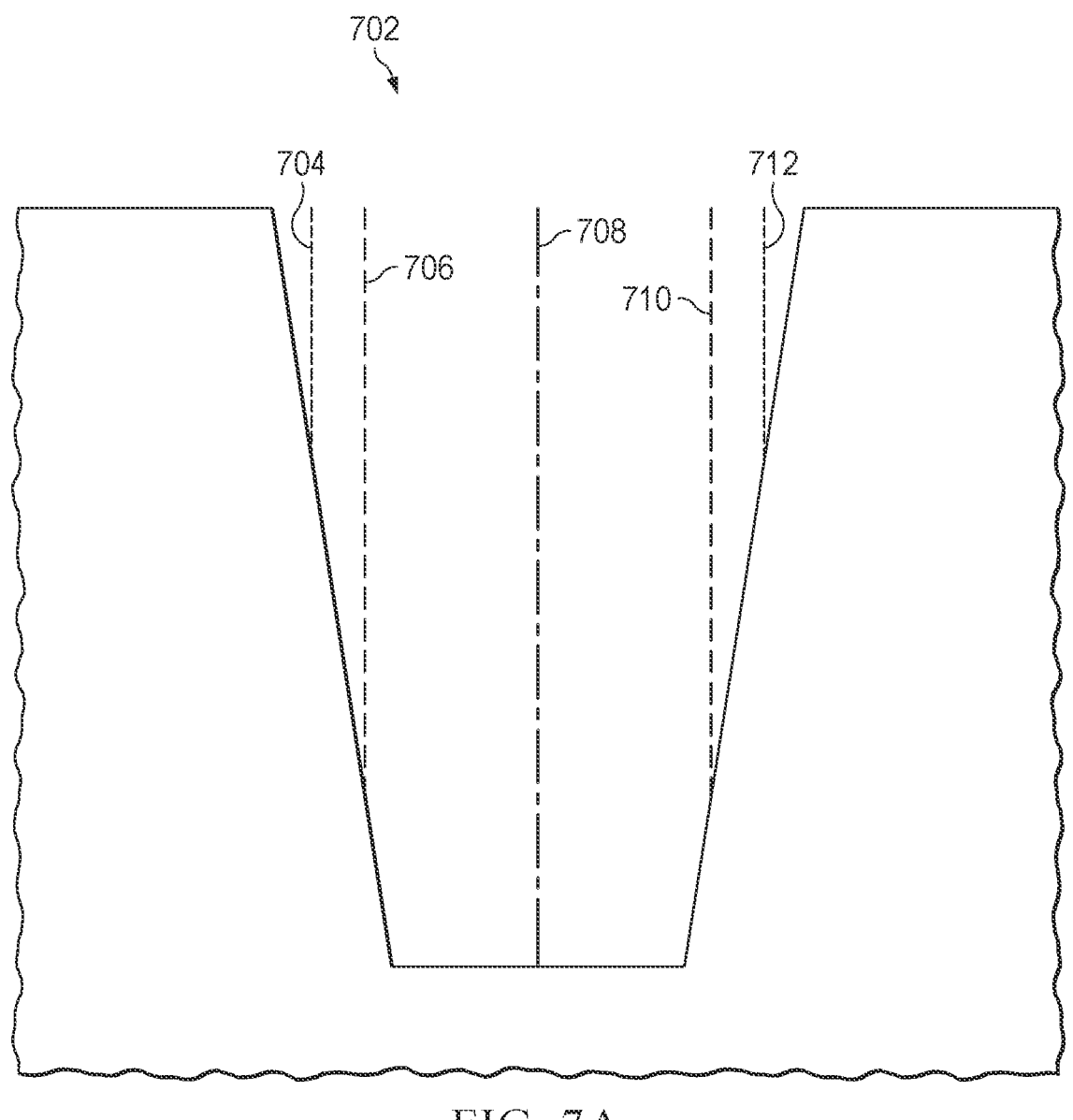
FIG. 7A is a cross-sectional view of an example lateral isolation trench.
Figure 7B:
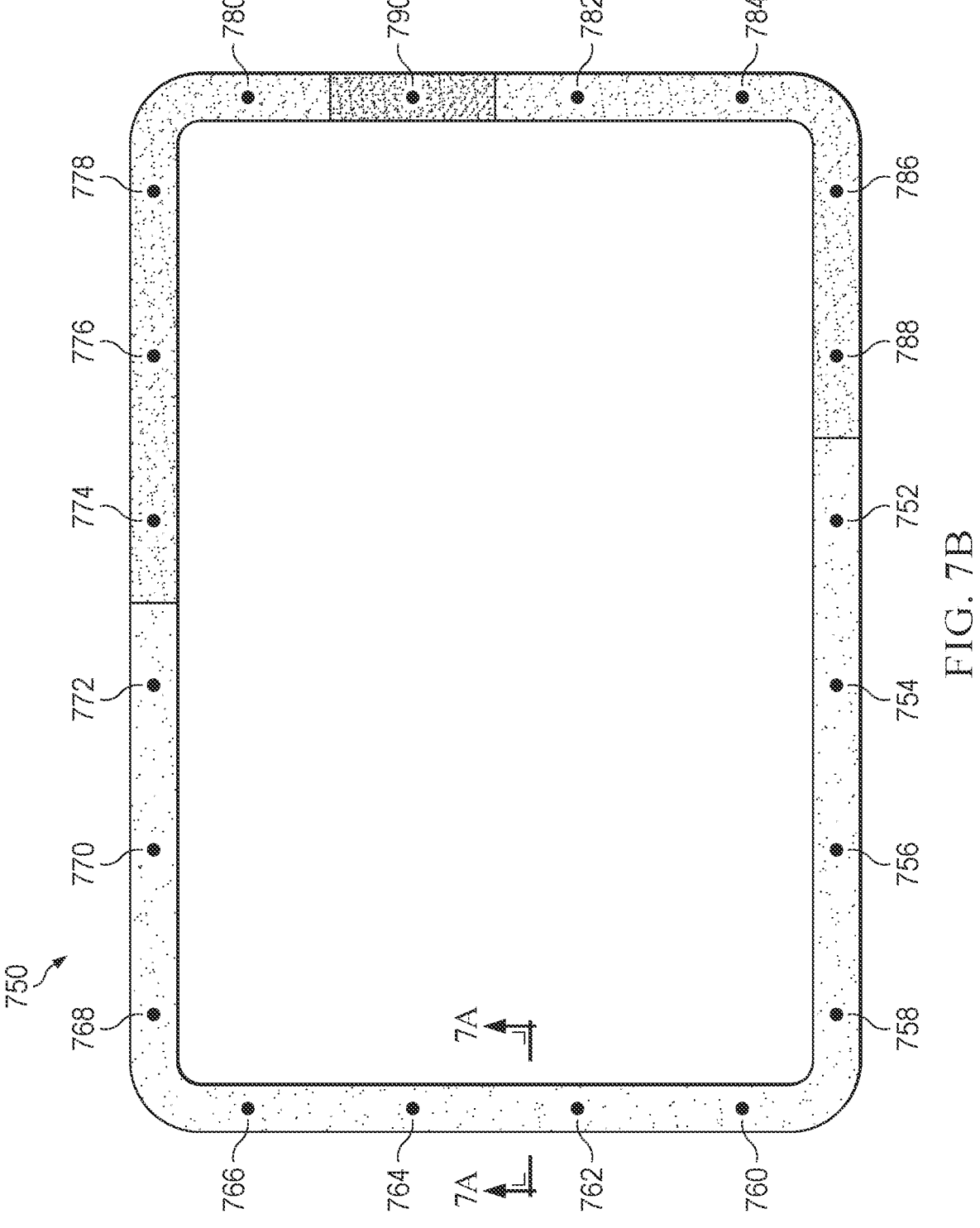
FIG. 7B is a top-down view of an example lateral isolation trench region.

The regions can be formed, e.g., as rings that completely laterally surround their respective tanks. These rings can be circular or have other shapes (e.g., elliptical, rectangular, square), with sharp or rounded corners. Referring to the view of an example trench 702 in FIG. 7A, which shows a cross-section cut orthogonal to the direction of the run of the trench 702, although the trench 702 viewed in cross-section may have a variety of depths 704, 706, 708, 710, 712, the depth of a trench at a given point on a trench region periphery can be considered as the deepest point 708 of the trench. The respective trench widths and trench depths of the trench regions 110, 112, 114, 116, 118, 120, 122, 124 in FIG. 1 can in some examples be approximately uniform over the respective peripheries of the trench regions. In other examples, the trench widths and trench depths may vary over the respective peripheries of the trench regions. A given trench region has at some point over its periphery a minimum trench width and a corresponding minimum trench depth. In the example trench region (e.g., ring) 750 shown in the top-down view of FIG. 7B, points 752 through 790 each represent the deepest depth at its respective point along the periphery of the trench region 750. Points 752 through 772 are of a first depth; points 774 through 788 are of a second, shallower depth; and point 790 is of a third, shallowest depth. In some examples, the depth of a trench region can be considered as the shallowest of a range of deepest cross-sectional depths of the trench region (e.g., the deepest cross-sectional depth 708 in FIG. 7A at point 790 in FIG. 7B). At any given point over a trench region periphery, the width of the trench can be related to its respective depth, in that a target depth to which a trench is etched can be defined by the corresponding trench width established, for example, by a lithographic mask. The wide deep trench regions 112, 116, 120, 124 are etched deeper into the semiconductor substrate than the narrow deep trench regions 110, 114, 118, 122.

The isolation of different active semiconductor devices in distinct dual deep-trench isolated tanks, as in FIG. 1, is area consumptive on the surface of an integrated circuit. Between each tank and its neighboring tank there are two narrow deep trench widths $W_N$, two inter-ring space widths $W_{IR}$, two wide deep trench widths $W_W$, and one inter-deep-trench width $W_{ID}$ between the respective deep trench regions of different tanks ($W_{ID}+2W_W+2W_N+2W_{IR}$).

Figure 2:
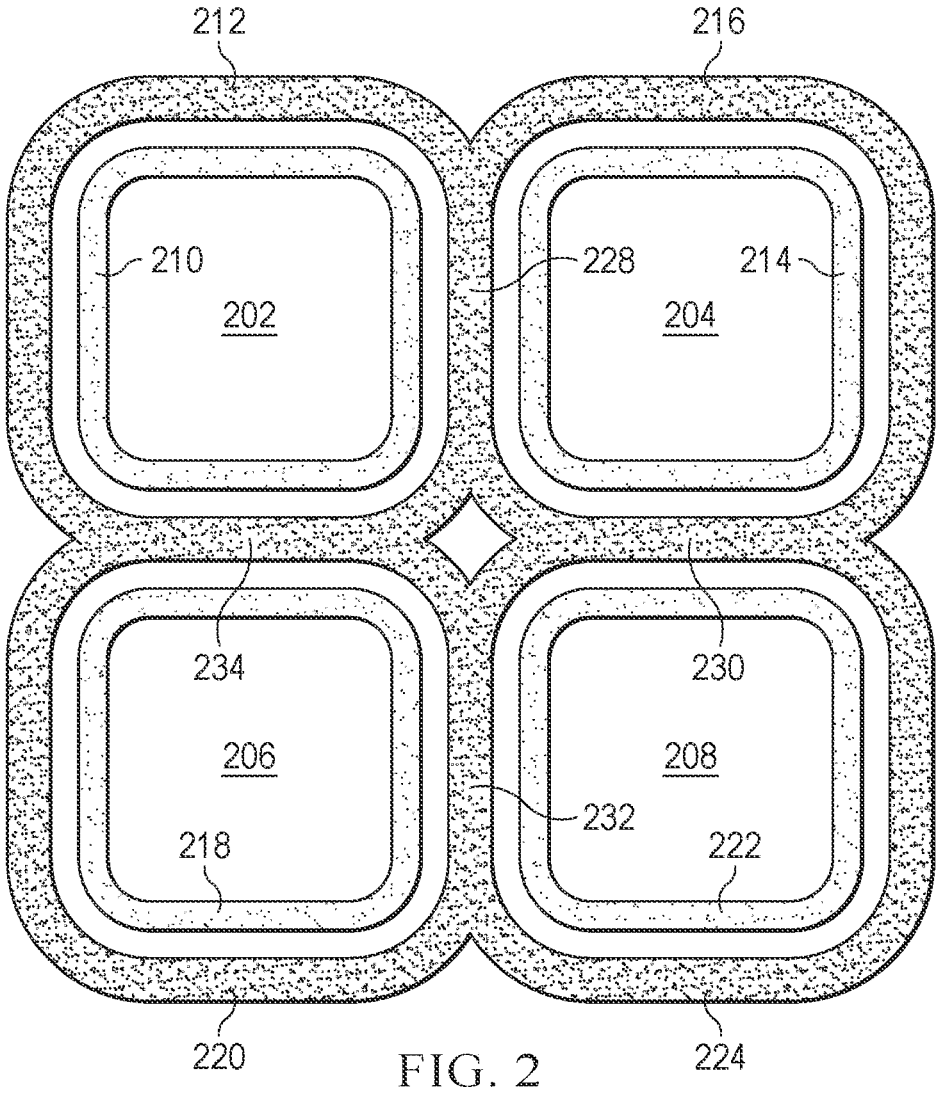
FIG. 2 is a top-down schematic view of an example portion of an integrated circuit having four isolation tanks each surrounded by a narrow deep trench and by merged wide deep trenches that share walls between tanks.

FIG. 2 shows, in a top-down view, a second dual deep-trench layout configuration in which four isolation tanks 202, 204, 206, 208 are spatially and electrically isolated from each other by dual trenches in a way that is less area-consumptive than the first dual deep-trench layout configuration of FIG. 1 by laterally merging the separate wide deep trench regions 212, 216, 220, 224 with each other. This lateral merging results in shared wide deep trench region portions in the example of FIG. 2. Thus, in the second dual deep-trench layout configuration shown in FIG. 2, first wide deep trench region 212 shares its "eastern" trench ring side with the "western" trench ring side of second wide deep trench region 216 as first shared trench portion 228; second wide deep trench region 216 shares its "southern" trench ring side with the "northern" trench ring side of third wide deep trench region 224 as second shared trench portion 230; third wide deep trench region 224 shares its "western" trench ring side with the "eastern" trench ring side of fourth wide deep trench region 220 as third shared trench portion 232; and fourth wide deep trench region 220 shares its "northern" trench ring side with the "southern" trench ring side of first wide deep trench region 212 as fourth shared trench portion 234.

The merging of external wide deep trench regions 212, 216, 220, 224 depicted in FIG. 2 saves area both by eliminating inter-ring space between the wide deep trench regions 212, 216, 220, 224 and by halving the space consumed by wide deep trench widths between tanks. Each tank 202, 204, 206, 208 in FIG. 2 is still surrounded by its own respective narrow deep trench region 210, 214, 218, 222. Thus, between each tank and its neighboring tank there are two narrow deep trench widths $W_N$, two inter-ring space widths $W_{IR}$, and one wide deep trench width $W_W$ ($W_W+2W_N+2W_{IR}$). This represents a one-dimensional inter-tank space savings of $W_{ID}+W_W$ over the layout configuration of FIG. 1.

Figure 3:
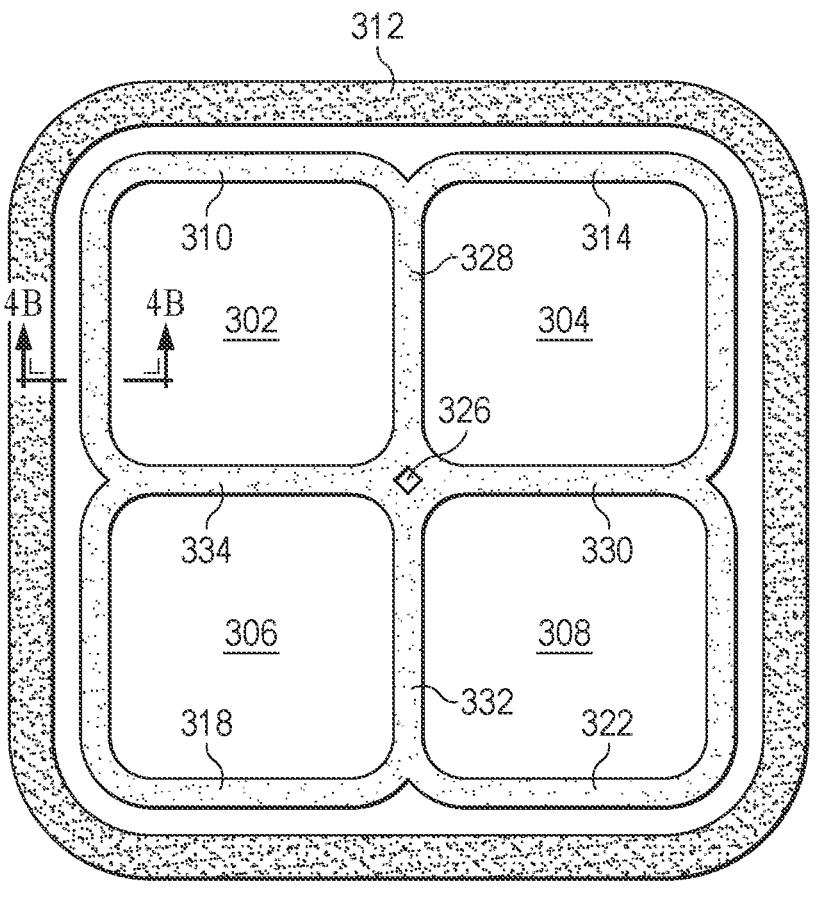
FIG. 3 is a top-down schematic view of an example portion of an integrated circuit having four isolation tanks each surrounded by merged narrow deep trenches inside a wide deep trench.

FIG. 3 shows, in a top-down view, a third dual deep-trench layout configuration in which four isolation tanks 302, 304, 306, 308 are spatially and electrically isolated from each other (laterally) by dual deep trenches in a way that is less area-consumptive than either the first dual deep-trench layout configuration shown in FIG. 1 or the second dual deep-trench layout configuration shown in FIG. 2. In the third dual deep-trench layout configuration shown in FIG. 3, the separate narrow deep trench regions 310, 314, 318, 322 are laterally merged with each other, and are laterally surrounded by a wide deep trench 312. This lateral merging results in shared narrow deep trench region portions in the example of FIG. 3. Thus, in the third dual deep-trench layout configuration shown in FIG. 3, first narrow deep trench region 310 shares its "eastern" trench ring side with the "western" trench ring side of second narrow deep trench region 314 as first shared trench portion 328; second narrow deep trench region 314 shares its "southern" trench ring side with the "northern" trench ring side of third narrow deep trench region 322 as second shared trench portion 330; third narrow deep trench region 322 shares its "western" trench ring side with the "eastern" trench ring side of fourth narrow deep trench region 318 as third shared trench portion 332; and fourth narrow deep trench region 318 shares its "northern" trench ring side with the "southern" trench ring side of first narrow deep trench region 310 as fourth shared trench portion 334.

The lateral merging of internal narrow deep trench regions 310, 314, 318, 322 depicted in FIG. 3 saves area over the second dual deep-trench layout configuration shown in FIG. 2 by eliminating lateral inter-ring space between the narrow deep trench regions 310, 314, 318, 322; by eliminating the width of the wide deep trench between tanks; and by halving the space consumed by narrow deep trench widths between tanks. Thus, between each tank 302, 304, 306, 308 and its neighboring tank there is only a single narrow deep trench width $W_N$. This represents a one-dimensional inter-tank space savings of $W_W+W_N+2W_{IR}$ over the second dual deep-trench layout configuration of FIG. 2 and a one-dimensional inter-tank space savings of $W_{ID}+2W_W+W_N+2W_{IR}$ over the first dual deep-trench layout configuration of FIG. 1.

As noted above with reference to FIGS. 7A and 7B, in some examples, the trench depth of a trench region can be considered as the shallowest depth (e.g., depth 790) of a range of deepest cross-sectional depths (e.g., depth 708) of the trench region. As an example, the wide deep trench region 312 can be etched to a depth of between about 25 micrometers and about 35 micrometers, e.g., about 30 micrometers, and each narrow deep trench region 310, 314, 318, 322 can be etched to a depth of between about 22 micrometers and about 30 micrometers, e.g., about 27 micrometers (in any case, shallower than the wide deep trench region 312).

In some examples, the trench width of a trench region can be considered as the widest cross-sectional width across the depth of the trench, e.g., at the mouth (upper opening) of the trench. As examples, the trench width in the wide deep trench region 312 can be between about 2.5 micrometers and about 3.5 micrometers, e.g., about 3 micrometers. The trench width of each narrow deep trench 310, 314, 318, 322 can be between about 1 micrometer and about 2 micrometers, e.g., about 1.7 micrometers. The inter-ring space width between a narrow deep trench and a wide deep trench can be between about 1 micrometer and about 2 micrometers, e.g., about 1.5 micrometers. The deep trench widths and intertrench space widths can vary with fabrication technology.

A merging center 326 of unetched semiconductor material is shown in FIG. 3 at the intersection of the four tanks 302, 304, 306, 308. A semiconductor (e.g., silicon) pillar is located at each merging center. Absent the unetched merging center 326—e.g., if the trench etch of the merged narrow deep trench regions 310, 314, 318, 322 were permitted to be spatially continuous at the location of the intersection of the four tanks 302, 304, 306, 308—the etched area at the multi-tank intersection could be too large to properly fill with conductive material (e.g., polysilicon). Such an oversized etched area could potentially result in one or more seams or crevices in the conductive fill that could lower the inter-tank breakdown voltage. Thus, leaving behind a pillar of unetched semiconductor material at the center 326 of a multi-tank intersection can be a beneficial feature. During the deep trench fabrication process, the pillar at the merging center 326 is coated all around (laterally) with a conformal trench sidewall insulating material (e.g., oxide) (shown as insulating liner 462 in FIG. 4B) and then further surrounded with a conductive material (e.g., polysilicon) (shown as poly fill 460 in FIG. 4B). The pillar 462 may also have a layer of shallow trench isolation (STI) oxide on top.

Although for simplicity of illustration the examples of FIGS. 1, 2, and 3 are shown with four tanks isolated from each other by narrow deep trenches, other examples using each of these layout configurations can have any number of trench-isolated tanks greater than one. For example, although FIG. 3 shows a 2×2 array of tanks, in other examples, the shared narrow deep-trench layout configuration of FIG. 3 can be implemented as a 1×2 array, a 2×1 array, a 3×2 array, a 2×3 array, a 3×3 array, a 4×3 array, a 3×4 array, a 4×4 array, and so on. Although the examples of FIGS. 1, 2, and 3 are shown with tanks arranged as regular arrays, in other examples, the tanks may be arranged as staggered arrays, or as honeycomb arrays. Arrays larger than 2×2 may have more than one merging center 326 at tank intersections. Multiple instances of a wide deep trench ringed layout configuration like that of FIG. 3 can be placed adjacent to each other on an integrated circuit, either with appropriate spacing between neighboring wide deep trench rings or with merged wide deep trench ring sides like those shown in FIG. 2. In the context of this description, a surrounded structure (active semiconductor device or trench region) laterally surrounded by a surrounding trench region has peripheral sidewalls and the surrounding trench region has an inner sidewall that is spaced from the peripheral sidewalls of the surrounded structure in a lateral direction.

6

Figure 4A:
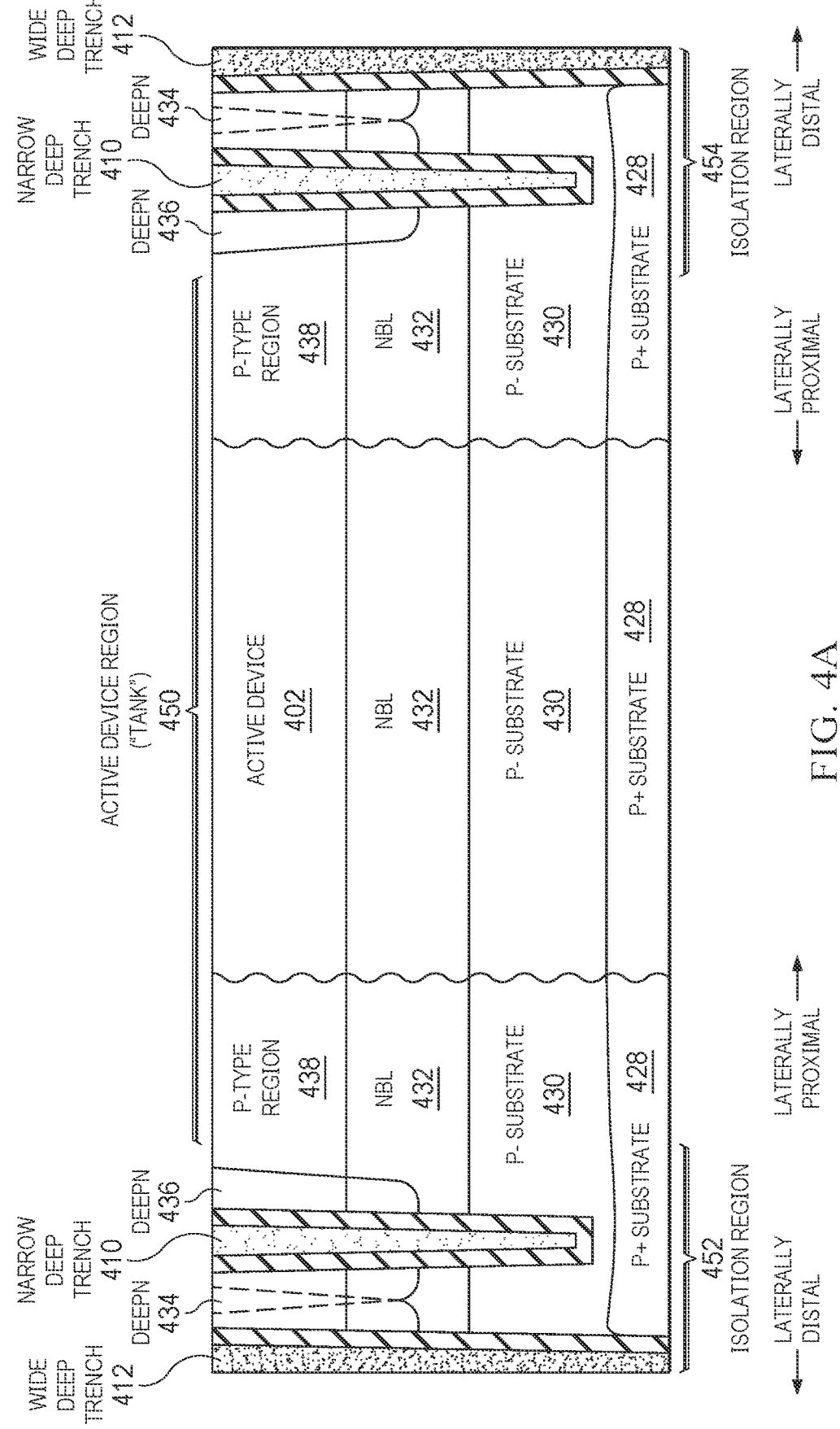
FIG. 4A is a cross-sectional view of a portion of an example lateral isolation region.
Figure 4B:
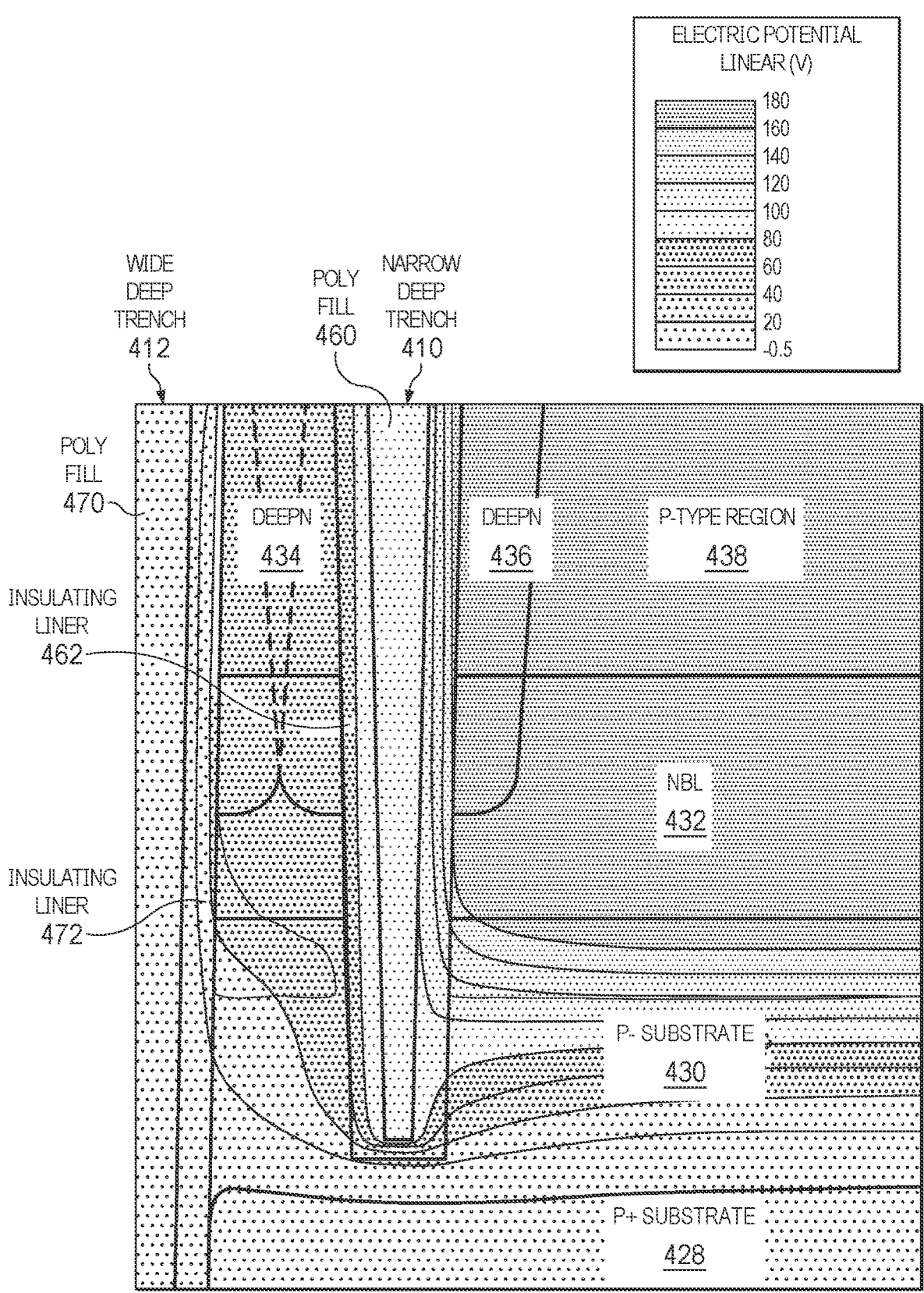
FIG. 4B is a cross-sectional view of a portion of an example lateral isolation region, corresponding to the section line 4B of the top-down view of FIG. 3 and also to isolation region 452 of the cross-sectional view of FIG. 4A.
Figure 5:
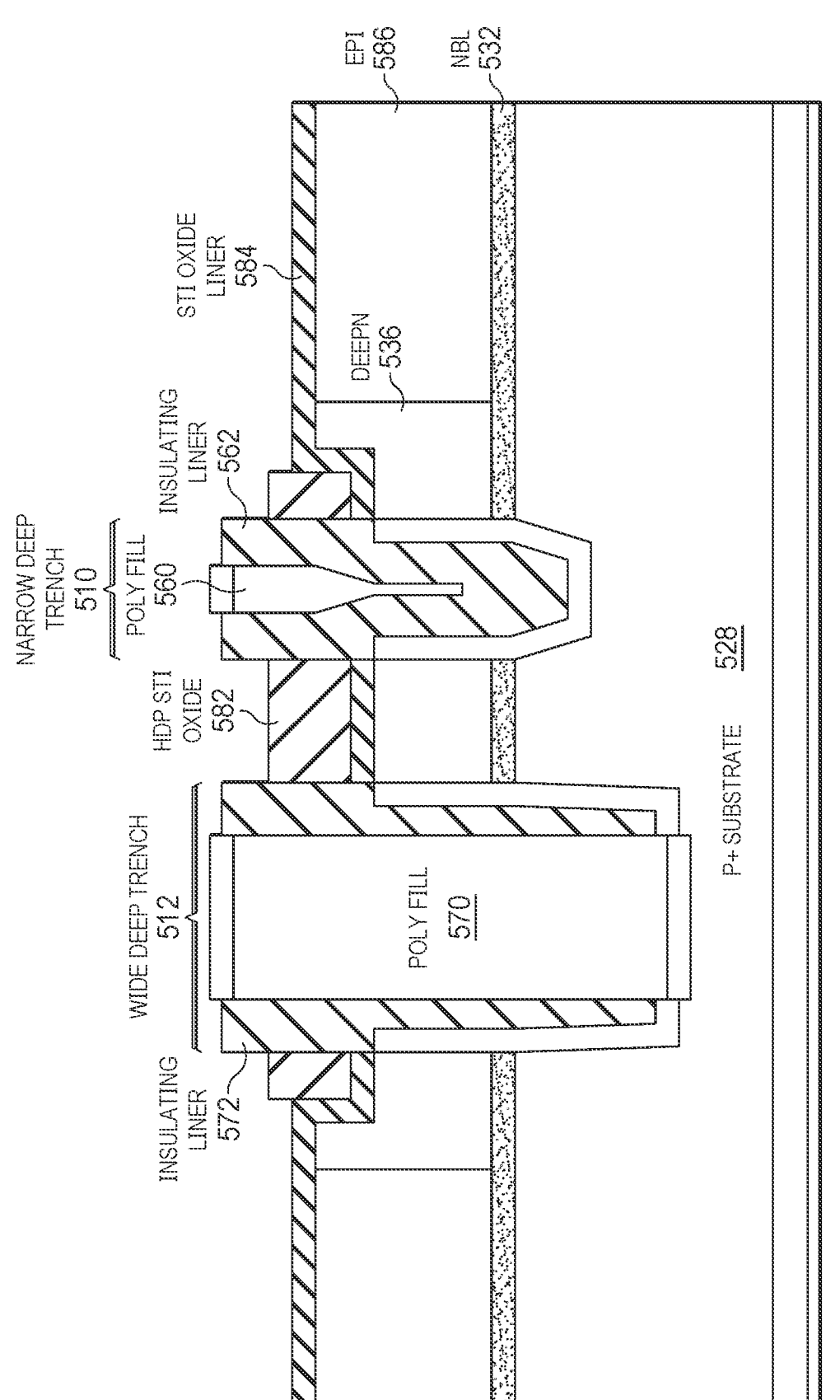
FIG. 5 is a cross-sectional view of a portion of an example lateral isolation region.

The cross-sectional view of FIG. 4A shows a portion of an example lateral isolation region illustrated as a left crosssection 452 of the isolation region and a right crosssection 454 of the isolation region, which, in the illustrated example, are bilaterally symmetrical mirror images of each other on opposite sides of active device region (isolation tank) 450. The tank 450 can include an active device 402 (or multiple active devices that do not require electrical isolation from each other) fabricated in a region 438 of a first conductivity type, e.g., p-type, that resides over an buried layer 432 of a second conductivity type, e.g., an n-type buried layer (NBL). Although FIGS. 4A, 4B, and 5 are illustrated as having the first conductivity type as p-type and the second conductivity type as n-type, in other examples, the first conductivity type can be n-type and the second conductivity type can be p-type, in which examples the illustrated doping types would be swapped, p for n and n for p. Beneath the NBL 432 in the example of FIG. 4A are p− doped region 430 and p+ doped region 428 of the substrate. DEEPN doped regions 434, 436 are formed by implants surrounding both wide and narrow deep trenches 412, 410. These DEEPN regions 434, 436 extend vertically down into NBL 432. Neighboring DEEPN implants merge in examples, such as the one illustrated in FIG. 4A, where the deep trenches 412, 410 are close to each other. Such DEEPN region merging is indicated by broken lines near reference indicator 434 in FIG. 4A. The remainder of the denoted regions of FIG. 4A are described with reference to FIG. 4B.

The cross-sectional view of FIG. 4B shows an example lateral isolation region corresponding to a zoomed-in view of isolation region 452 of FIG. 4A or of cross-section 4B in FIG. 3. An example electric potential distribution of the dual deep-trench layout configuration of FIG. 4B, illustrating the electrical isolation effectiveness of the illustrated configuration, is shown according to the included legend. The p− substrate layer 430 can be formed, for example, by a first epitaxial growth of semiconductor material (e.g., silicon) on top of the p+ substrate 428. NBL 432 can be formed by doping the p− substrate layer 430 with n-type dopants (e.g., phosphorous, antimony). A second epitaxial growth of semiconductor material (e.g., silicon) on top of the p− substrate 430 can form the p-type region 438. In other examples, the first epitaxial layer 430 is omitted, and the NBL 432 is doped directly on a p substrate corresponding to both layers 428 and 430 together.

The narrow deep trench 410 can form a ring surrounding an active device region in the p-type region 438 and, as shown in FIG. 3, one or more trench ring portions of a narrow deep trench region surrounding a given active device region can be shared with portions of narrow deep trench regions that surround neighboring active device regions. The narrow deep trench 410 can be formed by etching into the surrounding semiconductor (e.g., silicon) material (which can be, e.g., epitaxially grown), and can include one or several conformal insulating material layers 462 (e.g., an oxide or a nitride) to line the sidewalls and bottom of the narrow deep trench 410 and a conductive material 460 (e.g., polysilicon) to fill inside the narrow deep trench 410. The narrow deep trench 410 can be between about 1 micrometer and about 2 micrometers wide at the widest point along its depth, e.g., about 1.7 micrometers wide. The narrow deep trench 410 can be between about 22 micrometers and about 30 micrometers deep, e.g., about 27 micrometers deep. In any example, the narrow deep trench 410 is shallower than the wide deep trench 412.

The wide deep trench 412 can form a ring surrounding multiple active device regions each surrounded, within the wide deep trench ring, by their own merged narrow deep trench rings, as shown in FIG. 3. Like the narrow deep trench 410, the wide deep trench 412 can be formed by etching into the surrounding semiconductor material and can include one or several conformal insulating layers 472 (e.g., an oxide or a nitride) lining the sidewalls of the wide deep trench 412 and a conductive fill 470 (e.g., polysilicon) inside the wide deep trench 412. The wide deep trench 412 can be between about 2.5 micrometers and about 3.5 micrometers wide at the widest point along its depth, e.g., about 3 micrometers wide. The wide deep trench 412 can be between about 25 micrometers and about 35 micrometers deep, e.g., about 30 micrometers deep. In any example, the wide deep trench 412 is deeper than the narrow deep trench 410.

In some examples, the conformal insulating liner 462 of the narrow deep trench 410 coats not only the sidewalls of the narrow deep trench 410, but also the bottom of the narrow deep trench 410. Thus, the narrow deep trench conductive fill 460 (e.g., polysilicon) is floating, in that it does not directly contact any of the surrounding doped regions of the epitaxially grown semiconductor substrate, such as deep n-type regions DEEPN 434, 436, p− substrate 430, or p+ substrate 428. By contrast, in some examples, the wide deep trench conductive fill 470 (e.g., polysilicon) in the wide deep trench 412 directly contacts the p+ substrate 428 because of an absence of conformal insulating liner 472 at the bottom of the wide deep trench 412. Thus, the wide deep trench conductive fill 412 (e.g., polysilicon) can be used an electrical contact to the p+ substrate 428, e.g., to bias the p+ substrate 428 by application of a voltage to an electrically conductive contact (not shown) coupled at the top of the wide deep trench 412. Narrow deep trench 410 can be covered with a layer of insulator (e.g., an oxide) at the top surface. DEEPN 436 can be used to contact the NBL 432 via an electrically conductive contact (not shown) coupled at the top surface of the DEEPN 436.

The cross-sectional view of FIG. 5 shows a portion of an example lateral isolation region. NBL 532 in FIG. 5 can correspond to NBL 432 of FIGS. 4A and 4B. Narrow deep trench 510 and wide deep trench 512 of FIG. 5 can respectively correspond to narrow deep trench 410 and wide deep trench 412 of FIGS. 4A and 4B. Polysilicon fills 560 and 570 in FIG. 5 can respectively correspond to conductive fills 460 and 470 (e.g., polysilicon) in FIG. 4B. Conformal insulating liners 562 and 572 in FIG. 5 can respectively correspond to conformal insulating liners 462 and 472 in FIG. 4B. DEEPN 536 in FIG. 5 can correspond to DEEPN 436 in FIGS. 4A and 4B. The p+ substrate 528 in FIG. 5 can correspond to the p+ substrate 428 in FIGS. 4A and 4B. FIG. 5 also shows epitaxially grown silicon substrate 586, high-density-plasma (HDP) shallow trench isolation (STI) oxide 582, and STI oxide liner 584. Doped polysilicon 560 in narrow deep trench 510 is floating in that it does not make any contact to the substrate 528, whereas the doped polysilicon 570 in the wide deep trench 512 contacts the substrate 528 at the bottom and can therefore be used to bias the substrate with a voltage applied at an electrically conductive contact (not shown) coupled at the top surface of the wide deep trench 512.

The p+ substrate 428, 528 can be semiconductor material (e.g., silicon) doped (e.g., with boron) to a concentration of between about $4\times10^{18}$ ions/cm$^3$ and about $6\times10^{18}$ ions/cm$^3$ (e.g., about $5\times10^{18}$ ions/cm$^3$). Doped p− substrate 430 can be created by a first epitaxial growth of semiconductor material ("first p-epi"), e.g., silicon doped with boron at a concentration of between about $1\times10^{15}$ ions/cm$^3$ and about $2\times10^{15}$ ions/cm$^3$. Surface p-type region 438 can be created by a second epitaxial growth of semiconductor material ("second p-epi"), e.g., silicon doped with boron at a concentration of between about $1\times10^{15}$ ions/cm$^3$ and about $2\times10^{15}$ ions/cm$^3$. Antimony implanted at a concentration of between about $1\times10^{15}$ ions/cm$^3$ and about $3\times10^{15}$ ions/cm$^3$ (e.g., about $2\times10^{15}$ ions/cm$^3$) and phosphorous implanted at a concentration of about $2\times10^{13}$ ions/cm$^3$ and about $4\times10^{13}$ ions/cm$^3$ (e.g., about $3\times10^{13}$ ions/cm$^3$) can be used as the NBL 432, 532 implant species. Phosphorous implanted at a concentration of between about $1\times10^{15}$ ions/cm$^3$ and about $4\times10^{15}$ ions/cm$^3$ (e.g., about $2\times10^{15}$ ions/cm$^3$) can be used as the inter-trench DEEPN 434 implant species.

Insulating liners 462, 472, 562, 572 can be one or more layers of oxide (e.g., silicon dioxide) deposited using thermal oxidation, sub-atmospheric chemical vapor deposition (SACVD), or other methods. The thickness of the conformal insulating liners 462, 472, 562, 572 along the deep trench sidewalls can be, e.g., between 0.4 micrometers and 0.6 micrometers, e.g., 0.5 micrometers. In some examples, the oxide can be doped with a high-dielectric material to increase its breakdown voltage. Conductive fills 460, 470, 560, 570 can be, for example, in-situ doped (ISD) polysilicon or an amorphous silicon material doped with sufficient quantities of a selected dopant in order to achieve a desired level of conductivity. Alternatively, the conductive fills 460, 470, 560, 570 can comprise any other suitable conductor (e.g., a conductive metal or metal alloy).

Figure 6:
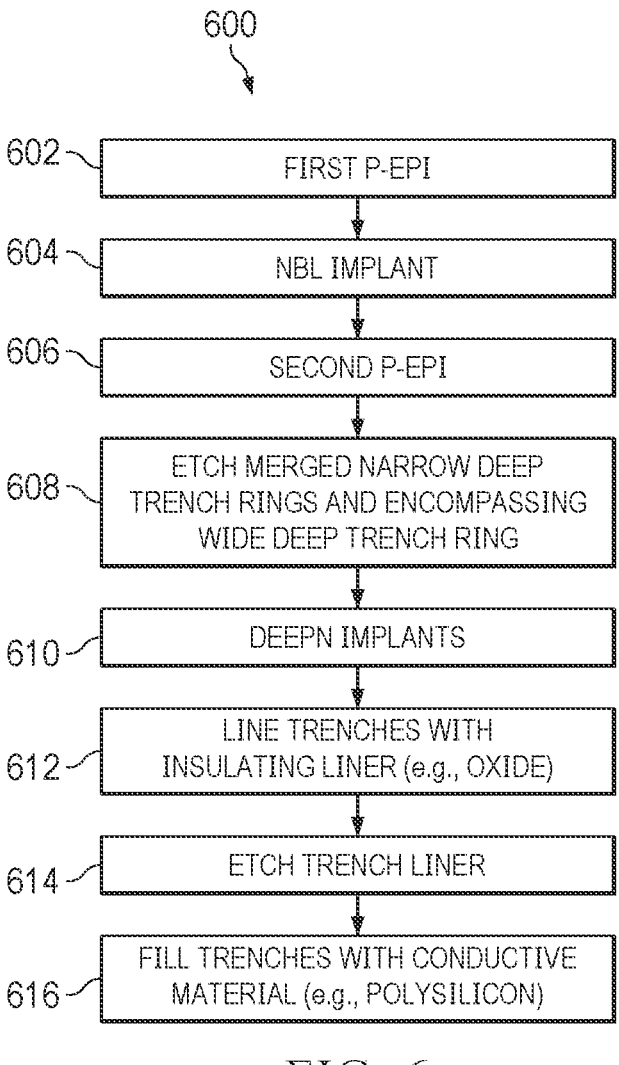
FIG. 6 is a flow chart of an example fabrication method.

The flow chart of FIG. 6 illustrates an example method 600 of fabricating merged trenches surrounded by a wider trench for laterally isolating semiconductor devices. In the illustrated example, first p-type doped epitaxial growth 602 of semiconductor material (e.g., boron-doped silicon) can be followed by an implant 604 of one or more n-type dopant species (e.g., antimony and/or phosphorous) into the epitaxially grown semiconductor material to form an NBL, such as NBL 432 or 532 in FIG. 4A, 4B, or 5. After implant 604, a second p-type doped epitaxial layer growth 606 of semiconductor material can be performed. In other examples, the first epitaxial growth 602 is omitted and the NBL implant 604 is performed directly into a p-type semiconductor substrate. Merged narrow deep trench regions (e.g., rings) and a wide deep trench region (e.g., ring) surrounding the merged narrow deep trench regions, having a layout configuration such as the one shown in FIG. 3, can be etched 608 through the epitaxially grown semiconductor material. The trench etch process can include, for example, forming a lithographic mask over the second p-epi material and etching away of the p-epi material down to a target depth in unmasked regions. The unmasked regions correspond to the locations for both the merged narrow deep trench regions (e.g., rings) and the wide deep trench region (e.g., ring) surrounding the merged narrow deep trench regions. The trench etch 608 can etch down through a trench hard mask, then further through a shallow trench isolation (STI) oxide (if present), and then still further down through semiconductor material (e.g., silicon). The trench etch 608 can be done in a single-step etch or multi-step etch. For example, a two-step etch can include an initial trench etch to etch through a surface layer into NBL (e.g., NBL 432 or 532); then, after DEEPN implant 610, a second trench etch can etch to target depth.

The target depth of the trench etch 608 for each trench can be based on the width of the unmasked region for the respective trench. The wider the unmasked region, the deeper the trench is etched 608, and, conversely, the narrower the unmasked region, the shallower the trench is etched 608. The width of the unmasked region for the wide deep trench can be configured to target the depth of the wide deep trench to at least the depth of a p+ substrate, such as substrate 428 or 528 in FIG. 4A, 4B, or 5. The width of the unmasked region for the narrow deep trench can be configured to target the depth of the narrow deep trench to a depth that is deeper than the depth of the NBL (e.g., NBL 432 or 532), but less than the depth of the p+ substrate. The trench widths and depths can be as described above with regard to FIGS. 3 and 4B.

DEEPN regions, such as an inter-ring DEEPN region (e.g., DEEPN 434 in FIGS. 4A and 4B) between the outside of the merged narrow deep trench rings and the inside of the wide deep trench ring, and an interior DEEPN region (e.g., DEEPN 436 in FIGS. 4A and 4B) inside the edges of the narrow deep trench rings, can be created by one or more tilted implantations 610 of an n-type dopant species, e.g., phosphorous, into exposed sidewalls of the trenches to form the DEEPN regions (e.g., DEEPN 434, 436 in FIGS. 4A and 4B). The tilted sidewall implantations 610 can be followed by one or more anneals to diffuse the sidewall dopant into the sidewall.

The sidewall and bottom of the narrow deep trench and wide deep trench are lined 612 with conformal insulating material (e.g., an oxide, such as silicon dioxide, or a nitride) deposited using thermal oxidation, SACVD, or other methods. In some examples, the lining 612 can be repeated with different materials. The resultant insulating liner (e.g., 462, 472, 562, or 572 in FIG. 4A, 4B, or 5) can thus be a single layer or a multi-layer of insulating materials. After the insulating lining 612, the resulting insulating liner can be etched 614 to remove the bottom trench liner in the wide deep trench, not etching through, and thus retaining, the bottom trench liner in narrow deep trenches. Both wide and deep trenches are then filled 616 with conductive material (e.g., polysilicon). This optional distinction in lining between the wide and narrow deep trenches provides a contact to the p+ substrate (e.g., substrate 428 or 528) via the wide deep trench (e.g., trench 412 or 512), permitting the p+ substrate to be biased with a voltage application to an electrically conductive contact (not shown) coupled to the top surface of the conductive fill of the wide deep trench (e.g., fill 470 or 570), whereas the conductive fill of the narrow deep trench (e.g., fill 460 or 570) remains floating. The DEEPN region inside the narrow deep trench rings (e.g., DEEPN 436, 536) can be used as an electrical contact to the NBL (e.g., NBL 432 or 532) so that the NBL can be biased by application of a voltage to an electrically conductive contact (not shown) coupled to the upper surface of this inner-narrow-deep-trench-ring DEEPN region.

Apart from the actions illustrated in FIG. 6 and described above, method 600 can further include a number of actions, such as various other epitaxial growth, mask, etch, implant, and anneal actions, that are not specifically shown or described herein. For example, method 600 can further include the fabrication of active semiconductor devices within the narrow deep trench rings. Method examples similar to those described can be implemented by swapping of the dopant conductivity types (n-type for p-type and p-type for n-type). In some examples, a field oxide layer is formed over the upper surfaces of the second p-epi and/or trench rings using either local oxidation of silicon (LOCOS) or shallow trench isolation (STI) processes. The field oxide layer can, for example, be formed at a thickness (depth) of between about 0.3 micrometers and about 1.0 micrometer.

In the semiconductor device layout configurations described herein, inner narrow deep trench regions share merged deep trench portions with neighboring narrow deep trench regions, and an outer wide deep trench region surrounds the merged narrow deep trench regions. A semiconductor device with merged narrow deep trenches inside a wide deep trench, as described herein and particularly as illustrated in FIG. 3, has the benefits over other lateral isolation configurations of die area savings and area utilization rate increase. In some examples, 10 percent or more area savings can be achieved over layout configurations that merge wide deep trenches, as shown in FIG. 2. Die component density is thereby increased and/or integrated circuit size is thereby reduced, thus reducing fabrication costs. Merged narrow deep trench layout configurations can be implemented in any fabrication technology (e.g., LBC9) that uses dual deep trenches, without costly modifications to existing fabrication process flows.

These benefits are obtained in merged narrow deep trench configurations with the possible tradeoff, over more-isolated configurations such as those shown in FIGS. 1 and 2, of less assurance of electrical isolation between tanked components. Risks of breakdown in merged narrow deep trench configurations can be managed by grouping together, within respective wide deep trench rings (e.g., ring 312 in FIG. 3), components less likely to experience larger inter-tank potential differences, and by customizing the narrow deep trench widths for the voltage ratings of the tanked components. As examples, tanked active semiconductor devices rated at between 75 V and 90 V may require wider merged narrow deep trenches between them than would tanked active semiconductor devices rated only at between 30 V and 40 V. A configuration as shown in FIGS. 3, 4A, and 4B has the further feature that the wide deep trench 312 or 412 can be biased by an applied voltage because of the connection of the wide deep trench 312 or 412 at its bottom to the p+ substrate 428, whereas the merged narrow deep trench 310, 314, 318, 322, or 410 is electrically isolated by conformal insulating liner 462 and thus remains floating. DEEPN 436 is connected to NBL 432 and can also be biased with an applied voltage.

In this description, the term "based on" means based at least in part on. Also, in this description, the term "couple" or "couples" means either an indirect or direct wired or wireless connection. Thus, if a first device, element, or component couples to a second device, element, or component, that coupling may be through a direct coupling or through an indirect coupling via other devices, elements, or components and connections. Similarly, a device, element, or component that is coupled between a first component or location and a second component or location may be through a direct connection or through an indirect connection via other devices, elements, or components and/or couplings. Modifications are possible in the described embodiments, and other embodiments are possible, within the scope of the claims.

What is claimed is:

1. An integrated circuit (IC) comprising:
a first active semiconductor device;
a first lateral isolation trench region laterally surrounding the first active semiconductor device, the first lateral isolation trench region having a first trench depth and a first trench width;
a second active semiconductor device;
a second lateral isolation trench region laterally surrounding the second active semiconductor device, the second lateral isolation trench region having a second trench depth and a second trench width, a portion of the second lateral isolation trench region being shared with a portion of the first lateral isolation trench region; and a third lateral isolation trench region laterally surrounding the first and second lateral isolation trench regions, the third lateral isolation trench region laterally spaced apart from the first and second lateral isolation trench regions, the third lateral isolation trench region having a third trench depth greater than the first and second trench depths, and the third lateral isolation trench region having a third trench width greater than the first and second trench widths.

2. The IC of claim 1, wherein a conductive fill of the third lateral isolation trench region is conductively coupled to a substrate of the IC of a first conductivity type, and respective conductive fills of the first and second lateral isolation trench regions are not conductively coupled to the substrate.

3. The IC of claim 2, further comprising a buried layer of a second conductivity type opposite the first conductivity type, wherein the first and second trench depths are more than a depth of the buried layer and less than a depth of the substrate.

4. The IC of claim 3, wherein the substrate is a p+ substrate, the buried layer is an n-type buried layer (NBL), and the first and second active semiconductor devices are fabricated in a p-type region over the NBL.

5. The IC of claim 1, wherein the shared portion of the first and second lateral isolation trench regions is a first shared portion, the IC further comprising:

a third active semiconductor device;

a fourth lateral isolation trench region laterally surrounding the third active semiconductor device, the fourth lateral isolation trench region having a fourth trench depth and a fourth trench width, the fourth lateral isolation trench region sharing a second shared portion with the second lateral isolation trench region;

a fourth active semiconductor device; and a fifth lateral isolation trench region laterally surrounding the fourth active semiconductor device, the fifth lateral isolation trench region having a fifth trench depth and a fifth trench width, the fifth lateral isolation trench region sharing a third shared portion with the fourth lateral isolation trench region and a fourth shared portion with the first lateral isolation trench region, wherein the third lateral isolation trench region laterally surrounds the first, second, fourth, and fifth lateral isolation trench regions, the third trench depth is deeper than the first, second, fourth, and fifth trench depths, and the third trench width is wider than the first, second, fourth, and fifth trench widths.

6. The IC of claim 5, further comprising a pillar of unetched semiconductor material at an intersection of the first, second, fourth, and fifth lateral isolation trench regions; and wherein:

an insulating material from each of the first, second, fourth, and fifth lateral isolation trench regions physically contacts the pillar of semiconductor material; and a conductive material from each of the first, second, fourth, and fifth lateral isolation trench regions laterally surrounds the the pillar of semiconductor material.

7. The IC of claim 5, wherein a conductive fill of the third lateral isolation trench region is conductively coupled to a substrate of the IC of a first conductivity type, and respective conductive fills of the first, second, fourth, and fifth lateral isolation trench regions are not conductively coupled to the substrate.

8. The IC of claim 1, wherein:

the first trench depth is a shallowest of a range of deepest cross-sectional depths of the first lateral isolation trench region, the second trench depth is a shallowest of a range of deepest cross-sectional depths of the second lateral isolation trench region, and the third trench depth is a shallowest of a range of deepest cross-sectional depths of the third lateral isolation trench region.

9. An integrated circuit (IC) comprising:

a substrate of a first conductivity type;

epitaxial semiconductor material over the substrate, the epitaxial semiconductor material having a surface region of the first conductivity type;

in the substrate or the epitaxial semiconductor material, a buried layer of a second conductivity type opposite the first conductivity type;

first and second active semiconductor devices in the surface region;

a first lateral isolation trench having a first portion between the first and second active semiconductor devices and a second portion not between the first and second active semiconductor devices at a first lateral distance from the first active semiconductor device, the first lateral isolation trench having a first width and a first depth, the first depth greater than a depth of the buried layer;

a second lateral isolation trench laterally surrounding the first lateral isolation trench and the first and second active semiconductor devices and at a second lateral distance from the first active semiconductor device, the second lateral distance greater than the first lateral distance, the second lateral isolation trench having a second width greater than the first width and a second depth greater than the first depth;

insulating material lining side and bottom surfaces of the first lateral isolation trench and side surfaces of the second lateral isolation trench; and conductive material filling the first and second lateral isolation trenches, the conductive material of the second lateral isolation trench electrically coupled to the substrate.

10. The IC of claim 9, further comprising:

a first doped region of the second conductivity type between the second lateral isolation trench and the second portion of the first lateral isolation trench and extending from the surface of the epitaxial semiconductor material to at least the buried layer; and a second doped region of the second conductivity type between the first lateral isolation trench and the surface region and extending from the surface of the epitaxial semiconductor material to at least the buried layer.

11. The IC of claim 9, wherein the first depth is between about 22 micrometers and about 30 micrometers, and the second depth is between about 25 micrometers and about 35 micrometers, and wherein the first width is between about 1 micrometer and about 2 micrometers, and the second width is between about 2.5 micrometers and about 3.5 micrometers.

12. The IC of claim 9, further comprising:

a first doped region of the second conductivity type at least a portion of the first lateral isolation trench and extending from the surface of the epitaxial semiconductor material to at least the buried layer; and a second doped region of the second conductivity type surrounding at least a portion of the second lateral isolation trench and extending from the surface of the epitaxial semiconductor material to at least the buried layer, wherein respective portions of first and second doped region overlap each other to form a merged doped region having the second conductivity type.

13. The IC of claim 12, wherein the merged doped region extends within the buried layer.

14. The IC of claim 12, wherein the first doped region and the second doped region extends to the same depth.

15. The IC of claim 1, wherein:

the first lateral isolation trench region and the second lateral isolation trench region are part of an array of merged lateral isolation trench regions, the array including an uneven number of merged lateral isolation trench regions; and the third lateral isolation trench region laterally surrounding the array of merged lateral isolation trench regions.

16. The IC of claim 1, further comprising:

a third active semiconductor device;

a fourth lateral isolation trench region laterally surrounding the third active semiconductor device, the fourth lateral isolation trench region having a fourth trench depth and a fourth trench width; and a fifth lateral isolation trench region laterally surrounding the fourth lateral isolation trench region, the fifth lateral isolation trench region having a fifth trench depth greater than the fourth trench depth, the fifth lateral isolation trench region having a fifth trench width greater than the fourth trench width, and wherein a portion of the fifth lateral isolation trench region being shared with a portion of the third lateral isolation trench region.

17. The IC of claim 1, further comprising a shallow trench isolation structure extending from the third lateral isolation trench region to the first lateral isolation trench region.

18. The IC of claim 17, further comprising:

a semiconductor material disposed over a substrate, the semiconductor material of a first conductivity type and the first active semiconductor device at least partially disposed in the semiconductor material;

a buried layer disposed over the substrate, the buried layer of a second conductivity type opposite the first conductivity type;

a first doped region of the second conductivity type disposed under the shallow trench isolation structure, the first doped region surrounding at least a portion of the first lateral isolation trench region and extending to at least the buried layer; and a second doped region of the second conductivity type disposed under the shallow trench isolation structure, the second doped region surrounding at least a portion of the third lateral isolation trench region and extending to at least the buried layer.

19. The IC of claim 18, wherein respective portions of first and second doped region overlap each other to form a merged doped region having the second conductivity type.

20. The IC of claim 1, wherein the third lateral isolation trench region laterally surrounds the first and second lateral isolation trench regions without extending between the first and second lateral isolation trench regions.

\* \* \* \* \*